(12) United States Patent
Abe et al.

(10) Patent No.: US 8,695,498 B2
(45) Date of Patent: Apr. 15, 2014

(54) SCREEN PRINTER

(75) Inventors: Seikou Abe, Osaka (JP); Toshiyuki Murakami, Yamanashi (JP)

(73) Assignee: Panasonic Corporation, Osaka (JP)

( * ) Notice: Subject to any disclaimer, the term of this patent is extended or adjusted under 35 U.S.C. 154(b) by 94 days.

(21) Appl. No.: 13/254,689

(22) PCT Filed: Jan. 6, 2011

(86) PCT No.: PCT/JP2011/000027
§ 371 (c)(1),
(2), (4) Date: Sep. 2, 2011

(87) PCT Pub. No.: WO2011/083765
PCT Pub. Date: Jul. 14, 2011

(65) Prior Publication Data
US 2012/0000381 A1    Jan. 5, 2012

(30) Foreign Application Priority Data
Jan. 8, 2010    (JP) ................. 2010-002515

(51) Int. Cl.
 *B05C 17/04*    (2006.01)
 *B41L 13/18*    (2006.01)
 *B41F 15/40*    (2006.01)

(52) U.S. Cl.
USPC .......................................... 101/123; 101/124

(58) Field of Classification Search
USPC .......... 101/114, 123, 124, 127, 129; 118/406, 118/410
See application file for complete search history.

(56) References Cited

U.S. PATENT DOCUMENTS 6,698,346 B2 *    3/2004    Shimizu et al. ............... 101/123
7,281,472 B2    10/2007    Sakaue et al.
(Continued)

FOREIGN PATENT DOCUMENTS

CN    1796109 A    7/2006
CN    1954649 A    4/2007
(Continued)

OTHER PUBLICATIONS
International Search Report for PCT/JP2011/000027 dated Feb. 15, 2011.
(Continued)

*Primary Examiner* — Ren Yan
*Assistant Examiner* — Marissa Ferguson Samreth
(74) *Attorney, Agent, or Firm* — Pearne & Gordon LLP

(57) ABSTRACT

A challenge to be met by the present invention is to provide a screen printer arranged so as to be able to readily perform both replacement of squeegees and operation for filling a paste feed syringe with paste. A paste feed syringe (14) is configured so as to be able to change its position between a paste feed attitude having an imaginary extension within a vertical plane at an oblique angle such that a nozzle (14a) provided at a lower end of the paste feed syringe comes to a position immediately below squeegees (15) and a storage attitude which is turned from the paste feed attitude through about 90 degrees around an axial line (41). When the paste feed syringe (14) is driven in a horizontal direction orthogonal to a direction of reciprocal movement of a squeegee base (30), a first cam follower (45) serving as a driven member disposed at a position below the axial line (41) of the paste feed syringe (14) is guided by a guide surface (44a) of a guide member (44), whereupon the paste feed syringe (14) is swayed around the axial line (41), to thus assume the storage attitude.

4 Claims, 16 Drawing Sheets

(56) References Cited

U.S. PATENT DOCUMENTS

| | | |
|---|---|---|
| 2002/0050217 A1 | 5/2002 | Shimizu et al. |
| 2006/0124003 A1 | 6/2006 | Sakaida et al. |
| 2011/0315029 A1* | 12/2011 | Abe et al. .................. 101/123 |

FOREIGN PATENT DOCUMENTS

| | | |
|---|---|---|
| JP | 63-293057 A | 11/1988 |
| JP | 04-107145 A | 4/1992 |
| JP | 10-157066 A | 6/1998 |
| JP | 2002-137360 A | 5/2002 |
| JP | 2005-161783 A | 6/2005 |
| JP | 2009-241428 A | 10/2009 |

OTHER PUBLICATIONS

Chinese Office Action for Application No. 201180001649 dated Nov. 1, 2013.

* cited by examiner

SCREEN PRINTER

TECHNICAL FIELD

The present invention relates to a screen printer that prints paste on a substrate by way of pattern holes opened in a mask plate.

BACKGROUND ART

A screen printer has a mask plate over which there is formed a mask pattern conforming to a layout of electrodes on a substrate and a squeegee installed on a squeegee base that horizontally travels back and forth above the mask plate. The screen printer brings the mask plate into contact with an upper surface of the substrate and actuates the squeegee back and forth along with the squeegee base while holding the squeegee in contact with the mask plate from above, so as to slide over the mask plate. Pattern holes of the mask pattern are thereby filled with paste, like solder paste and conductive paste, fed over the mask plate. The substrate and the mask plate are subsequently separated from each other, thereby transferring the paste over the substrate.

In such a screen printer, when the paste applied over the mask plate becomes lower in quantity, the paste is fed over the mask plate by means of a paste feed syringe (Patent Document 1). The paste feed syringes include one type of paste feed syringe that can move separately from a squeegee and another paste feed syringe that is actuated as one along with the squeegee while being installed on a squeegee base. The latter paste feed syringe enables simplification of a mechanism. In addition, when the paste in the paste feed syringe becomes deficient, it is possible to quickly refill the syringe with paste. Consequently, productivity of the substrate can be enhanced.

RELATED ART DOCUMENT

Patent Document

Patent Document 1: JP-A-4-107145

SUMMARY OF THE INVENTION

Problem that the Invention is to Solve

In such a screen printer, an operator must manually perform operation for refilling the paste feed syringe with paste from the front of the screen printer. To this end, the past feed syringe is preferably disposed at an area ahead of the squeegee base when viewed from an operator. However, the squeegee must be replaced, as required, in conformance with a substrate size, or the like. If the paste feed syringe is disposed at the area ahead of the squeegee base, it will become difficult to perform operation for replacing the squeegee, which raises a problem of poor operability.

Accordingly, the present invention aims at providing a screen printer configured so as to be able to readily perform squeegee replacement and operation for refilling the paste feed syringe with paste.

Means for Solving the Problem

A screen printer of the present invention includes: a mask plate which is brought into contact with an upper surface of a substrate and on which a mask pattern conforming to a layout of electrodes on the substrate is formed; squeegee that are attached to a squeegee base which reciprocally travels over an area above the mask plate in a horizontal direction, that moves in a horizontal direction along with the squeegee base while remaining in contact with the mask plate from above, and that makes sliding movement over the mask plate, thereby filling pattern holes of the mask pattern with paste raked on the mask plate; a paste feed syringe that is attached so as to be swayable around an axial line downwardly extending from the squeegee base at an angle with respect to a horizontal line and within a vertical plane parallel to the direction of reciprocal movement of the squeegee base and that can change its position between a paste feed attitude having an imaginary extension within the vertical plane at an oblique angle with respect to a vertical line such that a nozzle provided at a lower end of the paste feed syringe comes to a position immediately below the squeegee and a storage attitude which is turned from the paste feed attitude through about 90 degrees around the axial line; a syringe drive mechanism that drives the paste feed syringe in a horizontal direction orthogonal to the direction of reciprocal movement of the squeegee base; and a guide member having a guide surface that guides a driven member disposed at a position below the axial line of the paste feed syringe when the paste feed syringe in the paste feed attitude is driven in the horizontal direction orthogonal to the direction of reciprocal movement of the squeegee base by the syringe drive mechanism and that sways the paste feed syringe around the axial line through about 90 degrees, thereby bringing the paste feed syringe into the storage attitude.

In connection with the configuration, the paste feed syringe is disposed at an area ahead of the squeegee base as viewed from a working position of an operator.

The configuration further includes a cap member that, when the paste feed syringe in the paste feed attitude is driven by the syringe drive mechanism into the horizontal direction orthogonal to the direction of reciprocal movement of the squeegee base to thereby assume the storage attitude, is pressed and turned by a travel member that travels as one along with the paste feed syringe presses the paste feed syringe, thereby covering the nozzle of the paste feed syringe in the storage attitude.

Advantage of the Invention

In the present invention, the paste feed syringe is attached so as to be swayable around the axial line that downwardly extends from the squeegee base at an angle with respect to the horizontal line and within the vertical plane parallel to the direction of reciprocal movement of the squeegee base. The paste feed syringe can change its position between the paste feed attitude and the storage attitude such that the nozzle provided at the lower end of the paste feed syringe comes to the position immediately below the squeegees. Specifically, the paste feed attitude has an imaginary extension within the vertical plane extending in an oblique direction with respect to the vertical line, and the storage attitude is turned from the paste feed attitude through about 90 degrees around the axial line. Accordingly, even when the paste feed syringe is provided at an area ahead of the squeegee base as viewed from a working position of an operator such that operation for filling the paste feed syringe with paste becomes facilitated, the area ahead of the squeegee base can be switched to an open state by means of bringing the paste feed syringe into the storage attitude. Operation for replacing the squeegees can also be readily performed. Moreover, the syringe drive mechanism is utilized as a mechanism for switching the paste feed syringe from the paste feed attitude to the storage attitude. In order to cause the paste feed syringe to uniformly feed the paste over the substrate in its widthwise direction, the syringe drive mechanism drives the paste feed syringe in the horizontal direction orthogonal to the direction of reciprocal movement of the squeegee base. Therefore, the configuration for bringing the paste feed syringe into the storage attitude can be simplified.

EMBODIMENT FOR IMPLEMENTING THE INVENTION

Figure 1:
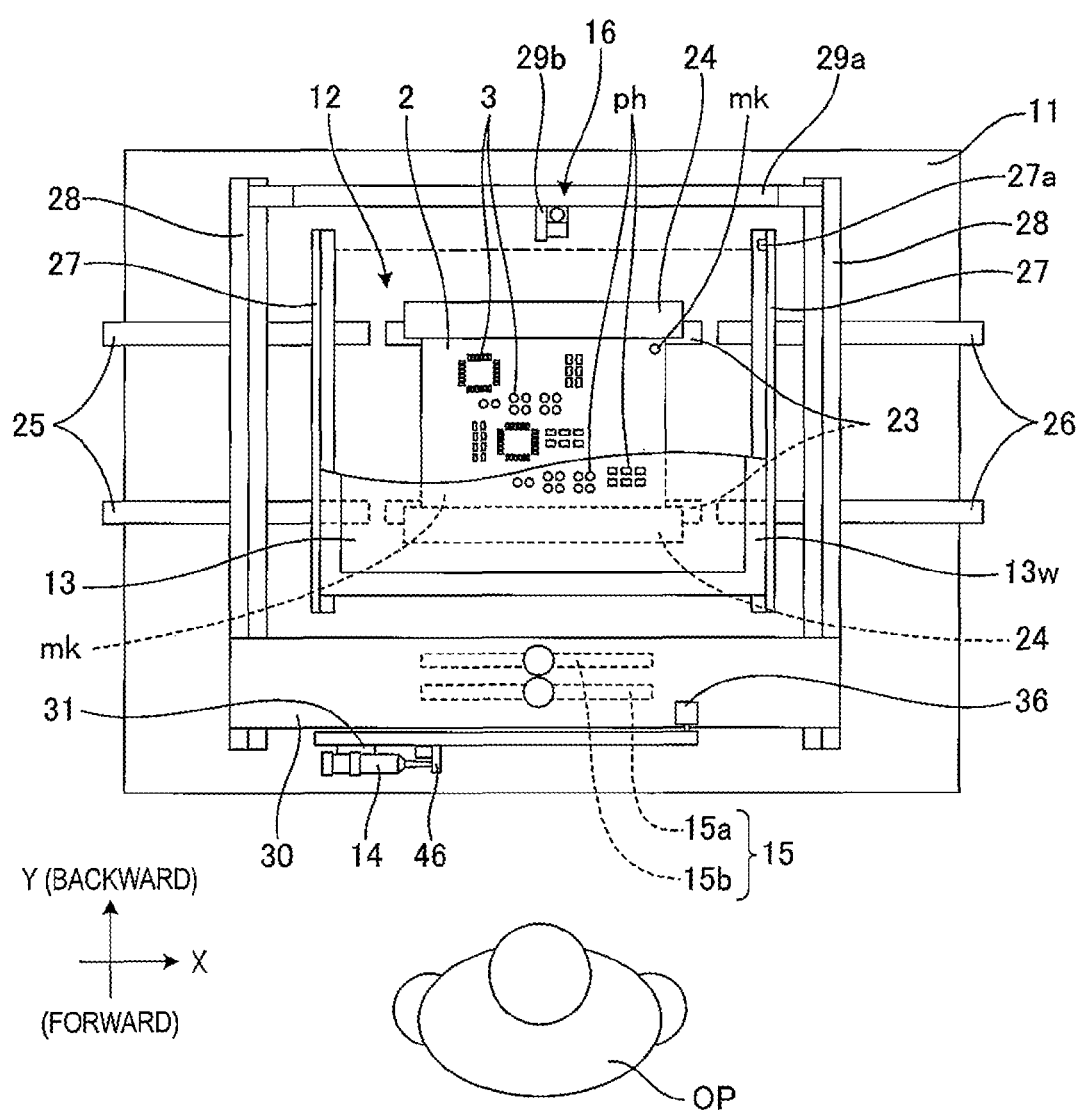
FIG. 1 is a plan view of a screen printer of an embodiment of the present invention.
Figure 2:
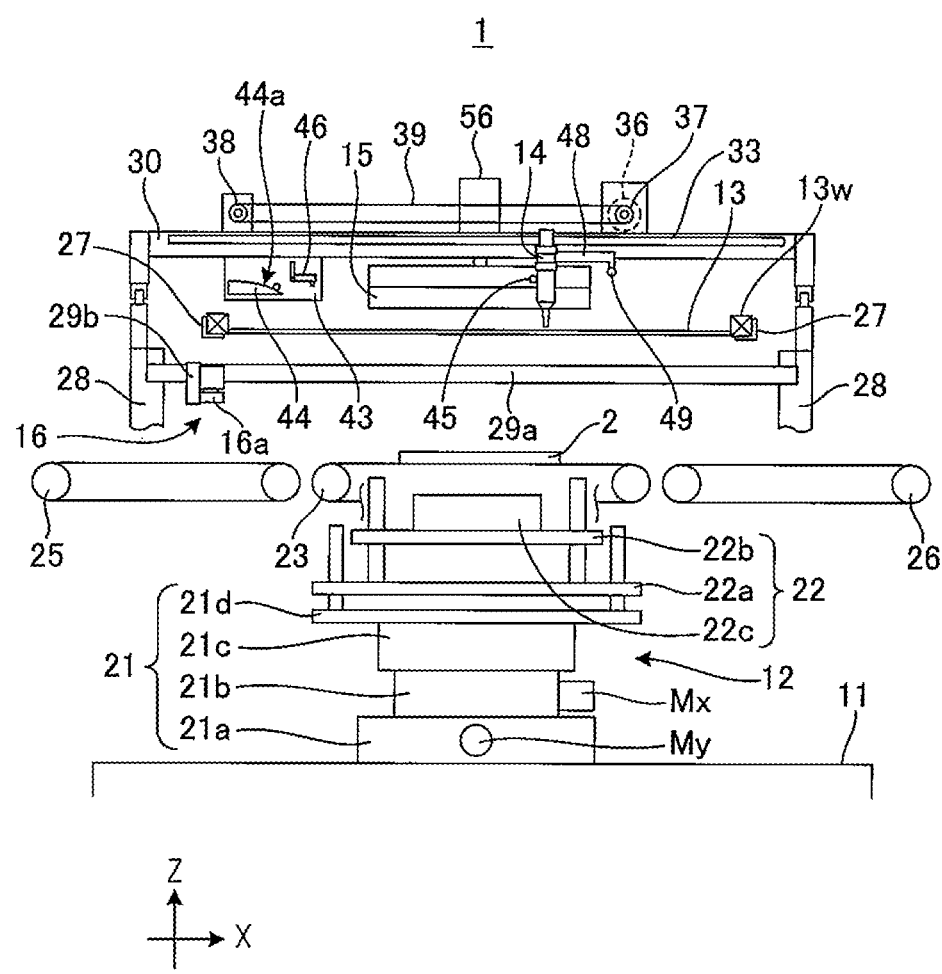
FIG. 2 is a front view of the screen printer of the embodiment of the present invention.
Figure 3:
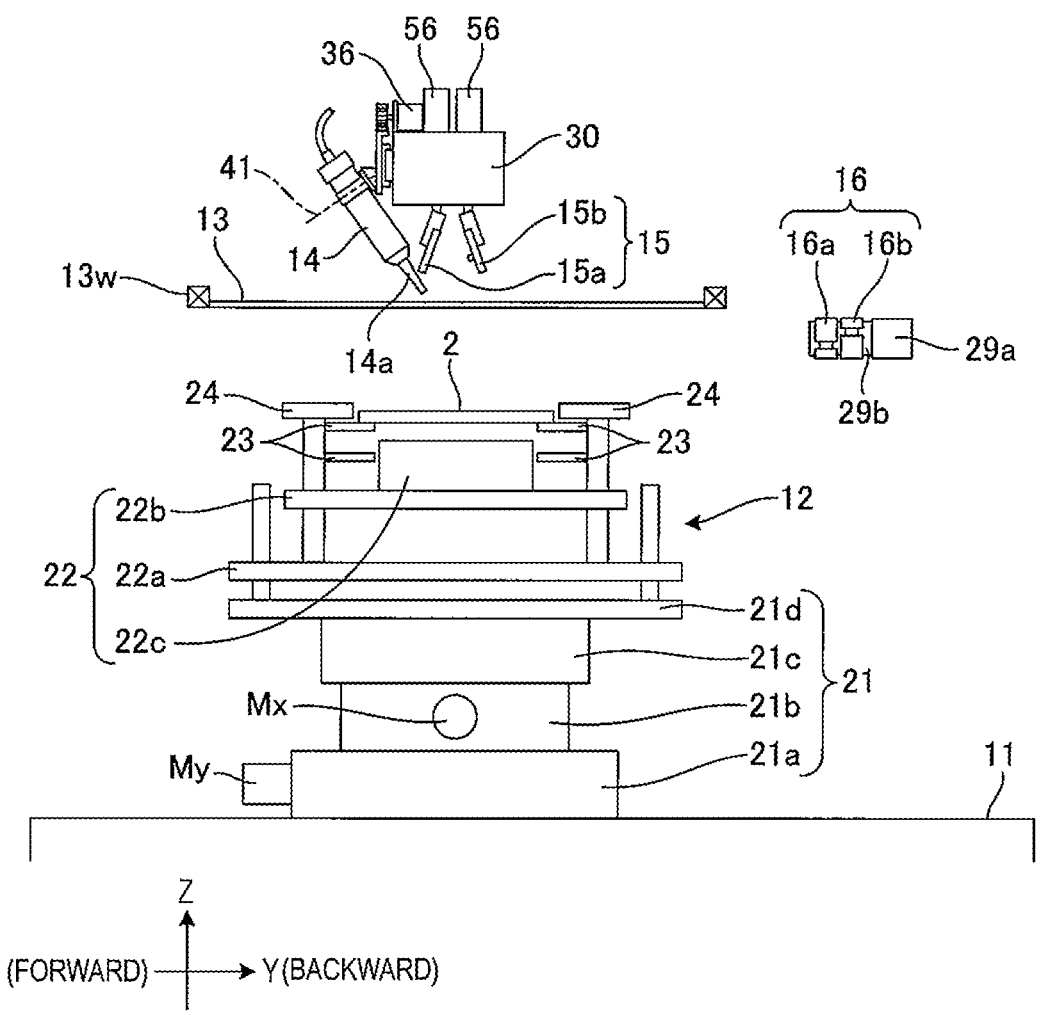
FIG. 3 is a side view of the screen printer of the embodiment of the present invention.

An embodiment of the present invention is hereunder described by reference to the drawings. In FIGS. 1, 2, and 3, a screen printer 1 of the present embodiment is for screen-printing paste, like solder paste and conductive paste, on electrodes 3 populated on a surface of a substrate 2. The screen printer includes a substrate positioning unit 12 that is set on a bench 11 and that conveys and positions the substrate 2 onto a predetermined working position, a mask plate 13 held at an elevated position above the substrate positioning unit 12, a paste feed syringe 14, a pair of squeegees 15, and a camera unit 16. For convenience of explanation, a direction of conveyance of the substrate 2 in the screen printer 1 (i.e., a horizontal direction of a drawing sheet of FIG. 1) is taken as an X-axis direction; a horizontal direction (a vertical direction of the drawing sheet of FIG. 1) orthogonal to the X-axis direction is taken as a Y-axis direction; and a vertical direction (a vertical direction of the drawing sheet of FIG. 2) is taken as a Z-axis direction. Further, a position (a lower position in the drawing sheet of FIG. 1) where an operator OP (FIG. 1) of the screen printer 1 performs operation on the screen printer 1 is taken as the front of the screen printer 1, whilst the other side of the position (i.e., an upper position in the drawing sheet of FIG. 1) is taken as the back of the screen printer 1.

In FIGS. 2 and 3, the substrate positioning unit 12 includes a horizontal inplane positioning section 21 and a vertical positioning section 22. The horizontal inplane positioning section 21 further includes a Y table 21a that moves in the Y-axis direction with respect to the bench 11; an X table 21b that moves in the X-axis direction with respect to the Y table 21a; a θ table 21c that turns around a Z-axis with respect to the X table 21b; and a base table 21d fixed to an upper surface of the θ table 21c. Moreover, the vertical positioning section 22 further includes a first elevation table 22a that ascends and descends with respect to the base table 21d of the horizontal inplane positioning section 21; a second elevation table 22b that ascends and descends with respect to the first elevation table 22a; and a receiver unit 22c placed on an upper surface of the second elevation table 22b. The substrate positioning unit 12 further includes a positioning conveyor 23 and a pair of clamping members (clampers) 24. The positioning conveyor 23 further includes a pair of belt conveyor mechanisms that are attached to the first elevation table 22a of the vertical positioning section 22; that convey the substrate 2 in the X-axis direction; and that place the substrate 2 at a predetermined working position. The clamping members 24 clamp (grasp) from the side both sides of the substrate 2 in the Y-axis direction on the positioning conveyor 23, thereby holding the substrate.

In FIGS. 1 and 2, a carry-in conveyor 25 and a discharge conveyor 26 are disposed at both ends of the positioning conveyor 23 that makes up the substrate positioning unit 12, with respect to the X-axis direction (i.e., one conveyor is at an upstream position and the other conveyor is at a downstream position with respect to the direction of conveyance of the substrate 2). The carry-in conveyor 25 conveys (performs carry-in of) the substrate 2 loaded from the outside (the left side of the drawing sheets of FIGS. 1 and 2) of the screen printer 1, thereby delivering the substrate to the positioning conveyor 23. Further, the discharge conveyor 26 conveys (discharges) the substrate 2 delivered from the positioning conveyor 23 to the outside (the right side of the drawing sheets of FIGS. 1 and 2) of the screen printer 1.

Figure 4:
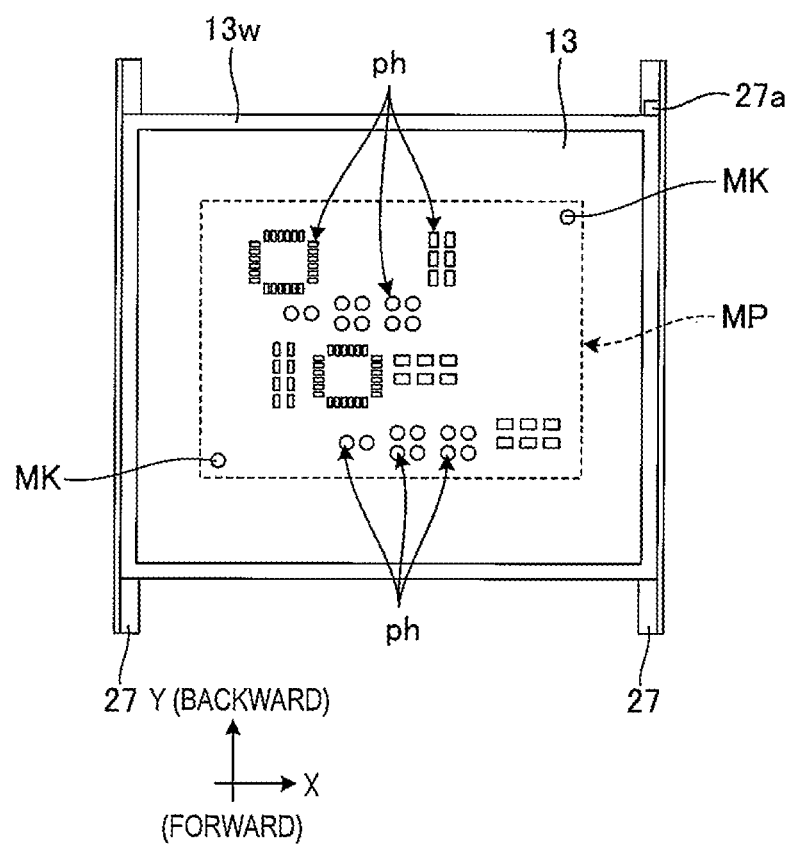
FIG. 4 is a plan view of a mask plate of the screen printer of the embodiment of the present invention.

In FIGS. 1 and 4, four sides of the mask plate 13 are supported by a frame member 13w assuming a rectangular profile when viewed in plane. A mask pattern MP including a plurality of pattern holes ph provided in conformance with a plurality of electrodes 3 on the substrate 2 (i.e., a layout of the electrodes 3) is formed within a rectangular area surrounded by the frame member 13w.

In FIG. 1, a pair of substrate-side register marks mk are placed at diagonal positions on the substrate 2. In the meantime, as shown in FIG. 4, a pair of mask-side register marks MK arranged in conformance with the respective substrate-side register marks mk are placed on the mask plate 13.

Griping both sides of the mask plate 13 with both hands, the operator OP inserts the mask plate 13 into spacing between a pair of support rails 27 (FIGS. 1 and 4) that extend from the front of the screen printer 1 in the Y-axis direction over the substrate positioning unit 12. The mask plate is further pushed to the back until a forefront of the frame member 13w comes into contact with a stopper 27a (FIGS. 1 and 4) provided on the support rails 27, whereupon the mask plate 13 is brought in place.

In FIGS. 1 and 2, a pair of gantry frames 28 spanning the carry-in conveyor 25 and the discharge conveyor 26 in the Y-axis direction are installed on the bench 11. In each of the pair of gantry frames 28, both ends of an X-axis stage 29a extending in the X-axis direction are supported so as to be slidable in the Y-axis direction. A camera support stage 29b is disposed on the X-axis stage 29a so as to be movable in the X-axis direction. The camera support stage 29b is outfitted with the previously-described camera unit 16. The camera unit 16 includes a first camera 16a whose imaging field of view is downwardly oriented and a second camera 16b whose imaging field of view is upwardly oriented (FIG. 3).

In FIG. 1, both ends of a squeegee base 30 extending in the X-axis direction are supported by the pair of gantry frames 28. The squeegee base 30 is reciprocally movable along the gantry frames 28 in the Y-axis direction. The squeegee base 30 is equipped with the pair of squeegees 15 so as to oppose each other in the Y-axis direction. Each of the squeegees 15 is made up of a spatula-shaped member extending in the X-axis direction, and the respective squeegees 15 are attached to the squeegee base 30 so as to be vertically movable. Of the pair of squeegees 15, a squeegee 15 disposed on the front is hereunder called a front squeegee 15a, and a squeegee 15 disposed on the back is hereunder called a back squeegee 15b.

Figure 5:
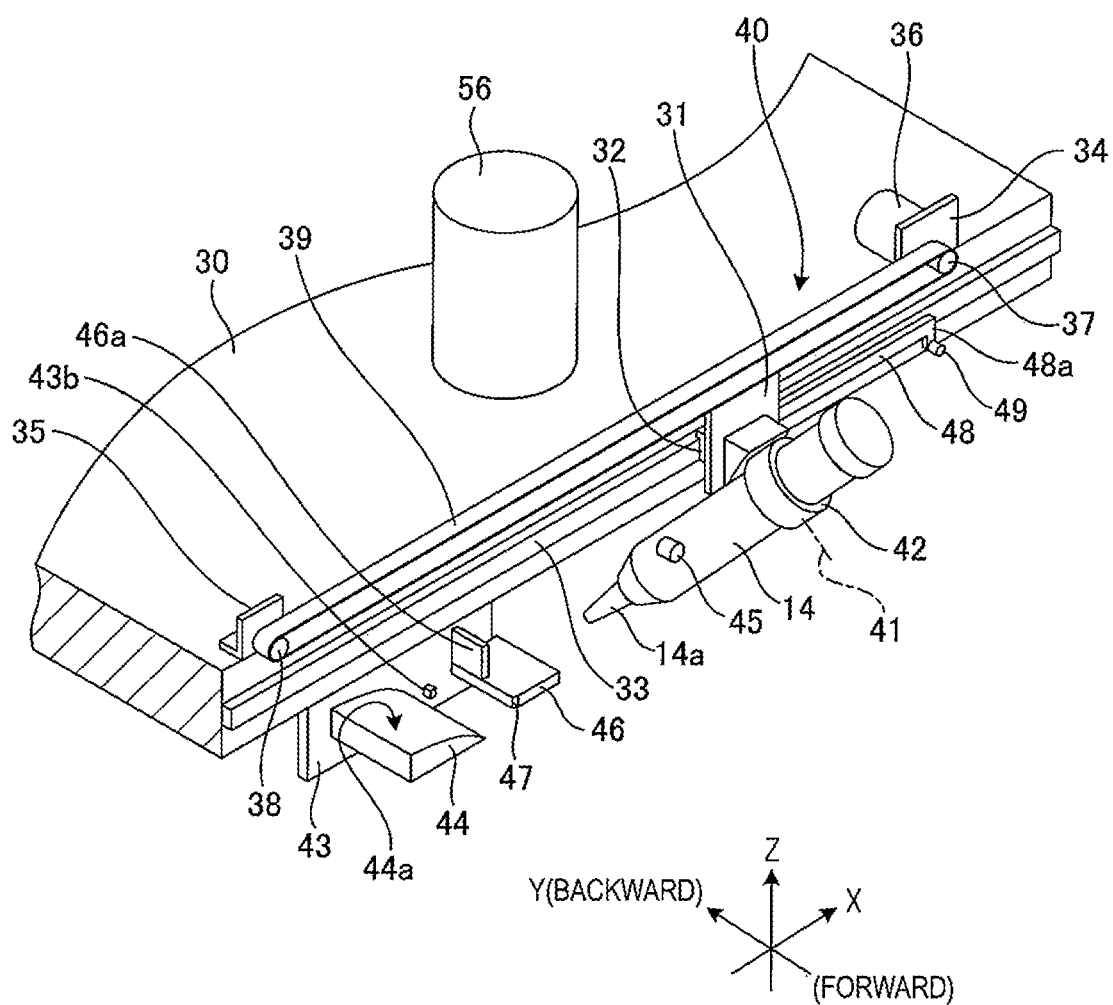
FIG. 5 is a fragmentary perspective view of a squeegee base provided in the screen printer of the embodiment of the present invention.
Figure 6:
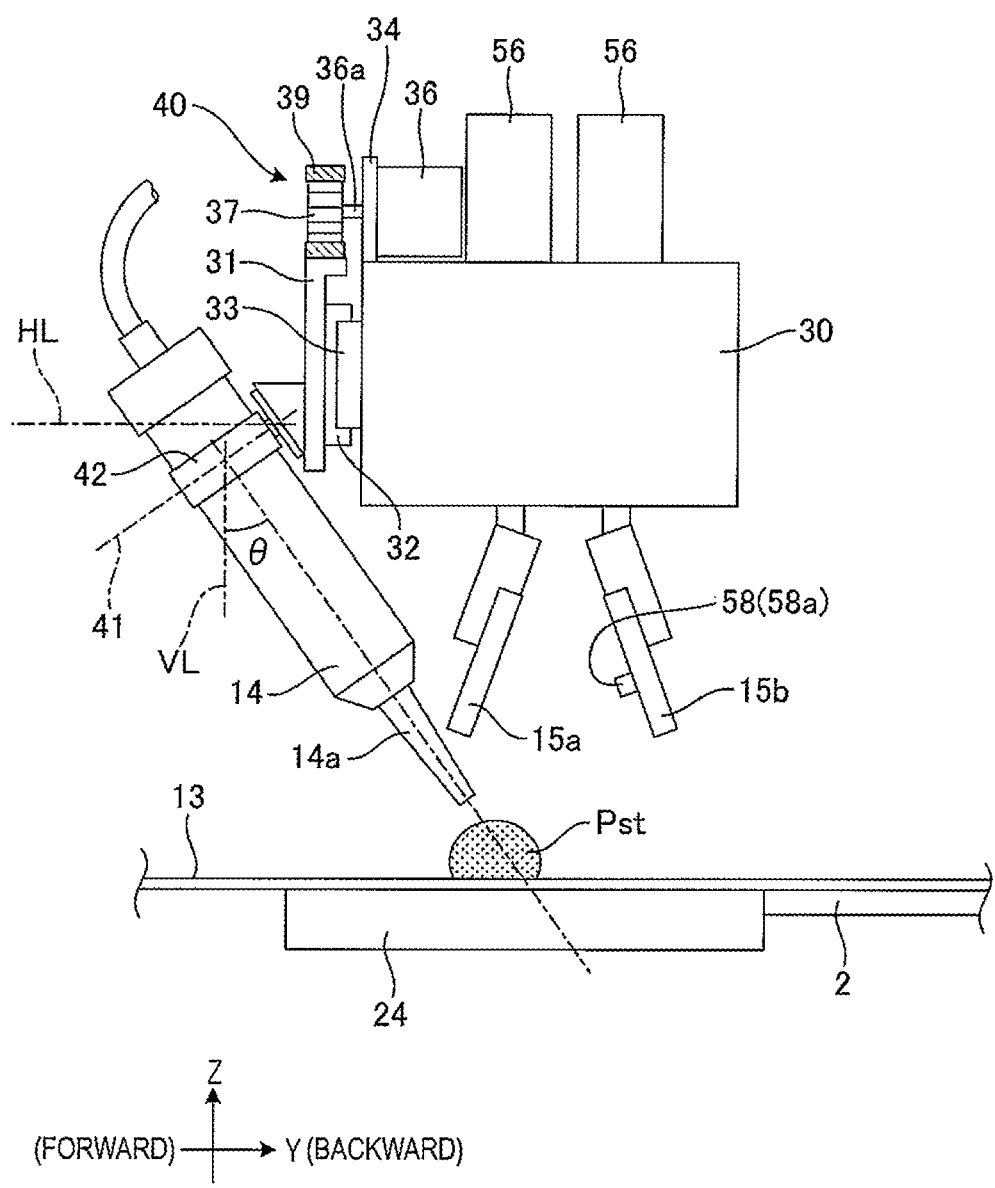
FIG. 6 is a side view of a neighborhood of a squeegee and a paste feed syringe of the screen printer of the embodiment of the present invention.

As shown in FIGS. 5 and 6, the paste feed syringe 14 is attached to a front area of the squeegee base 30 (the left side of a drawing sheet of FIG. 6) via a syringe attachment bracket 31. The syringe attachment bracket 31 becomes movable in a horizontal direction (the X-axis direction) orthogonal to the direction (the Y-axis direction) of reciprocal movement of the squeegee base 30 as a result of a slider 32 attached to a back surface opposing the squeegee base 30 coming into mesh with a slide guide 33 that is put on a front surface of the squeegee base 30 so as to extend in the X-axis direction.

Figure 7:
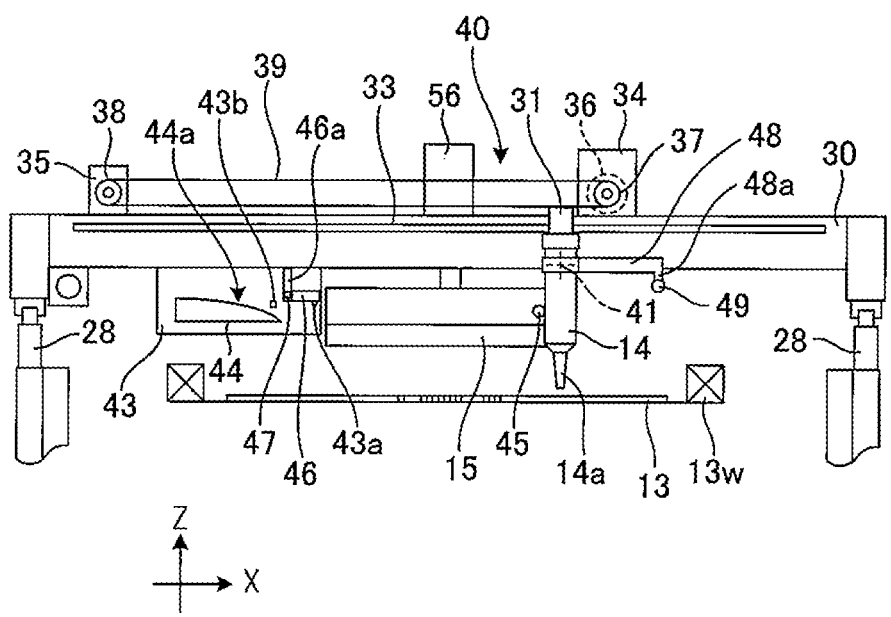
FIG. 7 is a front view of the neighborhood of the squeegee and the paste feed syringe of the screen printer of the embodiment of the present invention.

In FIGS. 5, 6, and 7, a pair of motor attachment brackets (a motor attachment bracket 34 and an idler pulley attachment bracket 35) are attached to both ends, in the X-axis direction, of a front end area of an upper surface of the squeegee base 30. A syringe drive motor 36 is attached to the motor attachment bracket 34. A drive shaft 36a (FIG. 6) of the syringe drive motor 36 horizontally passes through the motor attachment bracket 34, extending forwardly. A drive pulley 37 is attached to a leading end of the drive shaft 36a. In the meantime, an idler pulley 38 is attached to a pulley shaft (not shown) horizontally extending to the front from the idler pulley attachment bracket 35.

In FIGS. 5, 6, and 7, a toothed belt 39 passes around the drive pulley 37 and the idler pulley 38. An upper surface of an upper portion of the syringe attachment bracket 31 is secured to a lower surface of the toothed belt 39. Because of this structure, when the drive pulley 37 is rotated as a result of the drive shaft 36a of the syringe drive motor 36 being actuated, the toothed belt 39 remaining in engagement with the drive pulley 37 and the idler pulley 38 travels in the X-axis direction, whereupon the syringe attachment bracket 31 (i.e., the paste feed syringe 14) moves, with respect to the squeegee base 30, in a direction (the X-axis direction) orthogonal to the direction (the Y-axis direction) of reciprocal movement of the squeegee base 30 across the front area of the squeegee base 30. In the present embodiment, a mechanism including the syringe drive motor 36, the drive pulley 37, the idler pulley 38, and the toothed belt 39 makes up a syringe drive mechanism 40 that drives the paste feed syringe 14 in the horizontal direction orthogonal to the direction (the Y-axis direction) of reciprocal movement of the squeegee base 30.

In a state of assuming a paste feed attitude shown in FIG. 6, the paste feed syringe 14 performs operation for feeding paste stored therein, like solder paste and conductive paste, in an obliquely downward direction. A range (a drive stroke) within which the syringe drive mechanism 40 drives the paste feed syringe 14 in the X-axis direction is assumed to be at least an extent capable of covering a width (a dimension achieved in the X-axis direction) of the substrate 2 handled by the screen printer 1.

In FIGS. 5, 6, and 7, a syringe holder 42 is put on the front surface of the syringe attachment bracket 31 disposed on the front of the squeegee base 30. The syringe holder 42 is swayable (turnable) around an axial line 41 extending in an obliquely downward, forward direction with respect to a horizontal line HL (FIG. 6) within a vertical plane (within a YZ plane parallel to the drawing sheet of FIG. 6) parallel to the direction of reciprocal movement (in the Y-axis direction) of the squeegee base 30. The paste feed syringe 14 is swayable (turnable) around the axial line 41 while being held by the syringe holder 42. For this reason, the paste feed syringe 14 held by the syringe holder 42 can switch its position between a paste feed attitude (FIGS. 5, 6, and 7) and a storage attitude (FIG. 1). The paste feed attitude is determined by an imaginary line that extends at a backward (toward the right side of the drawing sheet of FIG. 6) inclination of a predetermined angle θ with respect to a vertical line VL (FIG. 6) within the vertical plane (i.e., the YZ plane) such that a nozzle 14a on a lower end of the paste feed syringe comes to a position immediately below the front squeegee 15a. Further, the storage attitude is determined as a result of the paste feed syringe being turned through about 90 degrees around the axial line 41 from the paste feed attitude. The predetermined angle θ is arbitrarily set as an angle at which the paste feed syringe 14 in the paste feed attitude can feed paste to the position immediately below the front squeegee 15a.

Further, as shown in FIGS. 5 and 7, a guide member attachment bracket 43 extending in the downward direction is attached to a lower portion of the front of the squeegee base 30. A guide member (a cam member) 44 is put on a front surface of the guide member attachment bracket 43 so as to project to the front. The guide member 44 has a curved guide surface 44a with a gradual descent toward the center of the squeegee base 30 in the X-axis direction.

Figure 8:
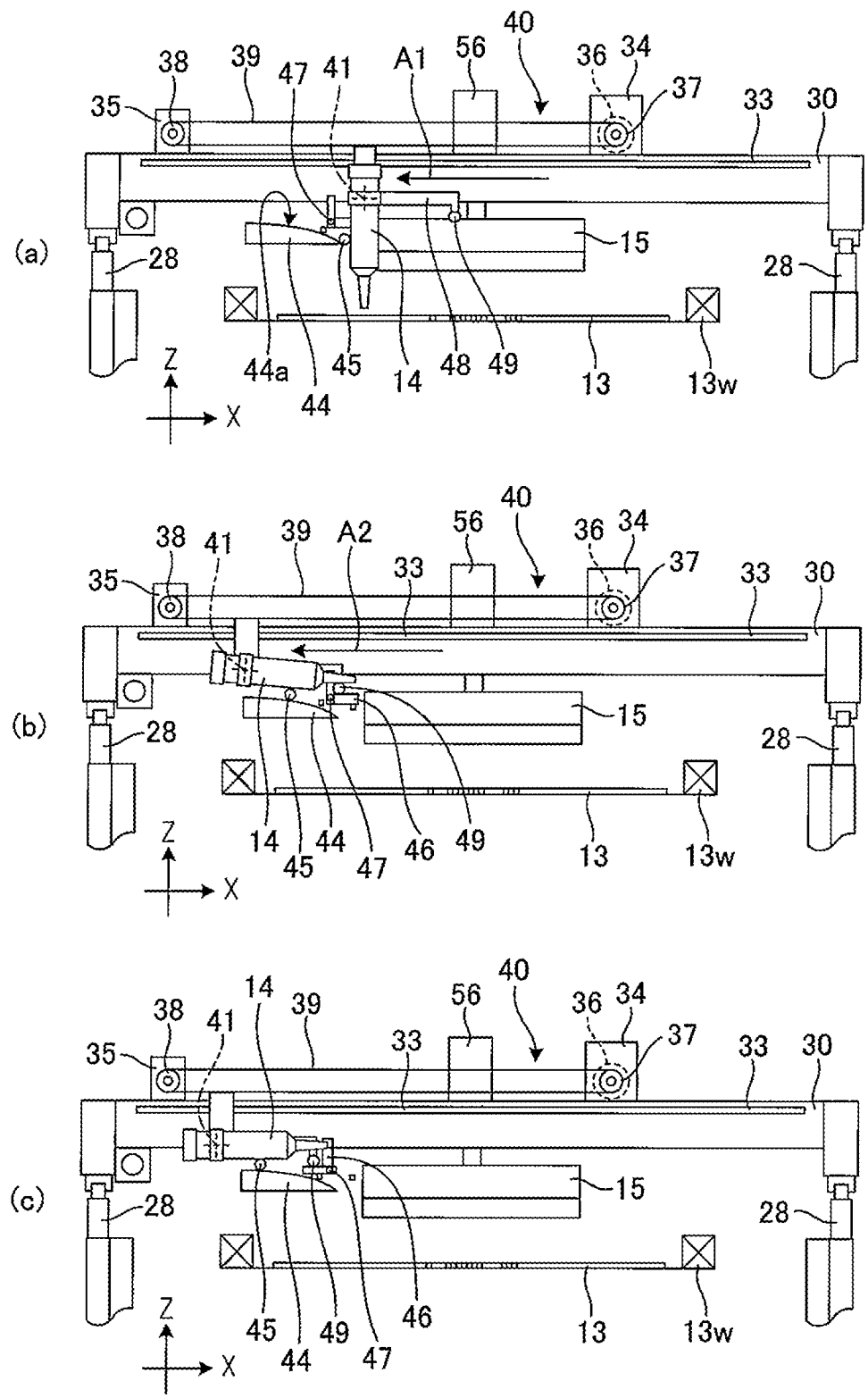
FIGS. 8 (a), (b), and (c) are front views of the neighborhood of the squeegee and the paste feed syringe of the screen printer of the embodiment of the present invention.

In the state where the paste feed syringe 14 assumes the paste feed attitude at the center of the squeegee base 30 in the Y-axis direction, the syringe drive motor 36 is driven, whereupon the paste feed syringe 14 is driven toward the end of the squeegee base 30 where the guide member 44 is positioned (i.e., the left side of the drawing sheet of FIG. 8). When the paste feed syringe 14 has reached a neighborhood of an end of the drive stroke of the paste feed syringe 14 [as designated by arrow A1 shown in FIG. 8(a)], a first cam follower 45, which is put at a position lower than the axial line 41 on the side surface of the paste feed syringe 14 so as to serve as a follower member, comes into contact with the guide surface 44a of the guide member 44 [FIG. 8(a)]. Further being driven toward the end of the squeegee base 30 where the guide member 44 is positioned [as designated by arrow A2 shown in FIG. 8(b)], the first cam follower 45 rolls over (is guided by) the guide surface 44a. As a consequence, the lower portion of the paste feed syringe 14 is raised by the guide member 44, to thus sway around the axial line 41 [FIG. 8(b)] and finally assume a horizontal storage attitude [FIG. 8(c)] to which the paste feed syringe has swayed through about 90 degrees.

In the present embodiment, when the paste feed syringe 14 in the paste feed attitude is driven in the horizontal direction (the X-axis direction) orthogonal to the direction of reciprocal movement of the squeegee base 30 (the Y-axis direction) by the syringe drive mechanism 40, the guide member 44 guides the first cam follower 45 put on the position on the paste feed syringe 14 lower than the axial line 41, thereby letting the paste feed syringe 14 sway around the axial line 41 through about 90 degrees, to thus be brought into the storage attitude.

The squeegee 15 must be replaced, as required, in conformance with the size of the substrate 2, or the like. During replacement of the squeegee 15, the operator OP inserts his/her hands into a position below the squeegee base 30 from the front of the screen printer 1. However, the screen printer 1 of the present embodiment is configured so as to be able to switch the paste feed syringe 14 from the paste feed attitude to the storage attitude as mentioned above. Therefore, even when the paste feed syringe 14 is positioned at an area ahead of a work position of the operator OP of the squeegee base 30, the area ahead of the squeegee base 30 can be opened by means of switching the paste feed syringe 14 to the storage attitude, so that the operator can readily replace the squeegee 15. The syringe drive mechanism 40 is utilized as a mechanism for switching the paste feed syringe 14 from the paste feed attitude to the storage attitude. The syringe drive mechanism 40 drives the paste feed syringe 14 to the horizontal direction orthogonal to the direction of reciprocal movement of the squeegee base 30 in order to uniformly feed paste Pst over the substrate 2 in its widthwise direction. Accordingly, a configuration for bringing the paste feed syringe 14 into the storage attitude can be simply implemented.

In FIGS. 5 and 7, a cap member 46 is attached to a position on a front surface of the guide member attachment bracket 43 that is closer toward the center (the right side of the drawing sheets of FIGS. 5 and 7) of the squeegee base 30 than the location where the guide member 44 is disposed. One end of the cap member 46 is swayingly supported by a cap member swaying shaft 47 that projects from the front surface of the guide member attachment bracket 43 in a horizontally forward direction (the Y-axis direction). The cap member 46 is swayable around its side (a swayingly-supported end) swayingly supported by the cap member swaying shaft 47 between a horizontal attitude [an unclosed attitude shown in FIG. 5, FIG. 8(a), and FIG. 9(a)] and a vertical attitude [a closed attitude shown in FIG. 8(c) and FIG. 9(b)]. In the horizontal attitude, a remaining end of the cap member 46 (a swayingly-unsupported end) is situated at a position closer to the center of the squeegee base 30 with respect to the cap member swaying shaft 47, where the swayingly-unsupported end comes into contact with, from above, a first stopper 43a (FIG. 7) put on the front surface of the guide member attachment bracket 43. In the vertical attitude, the swayingly-unsupported end is situated at a position immediately above the cap member swaying shaft 47.

Figure 9:
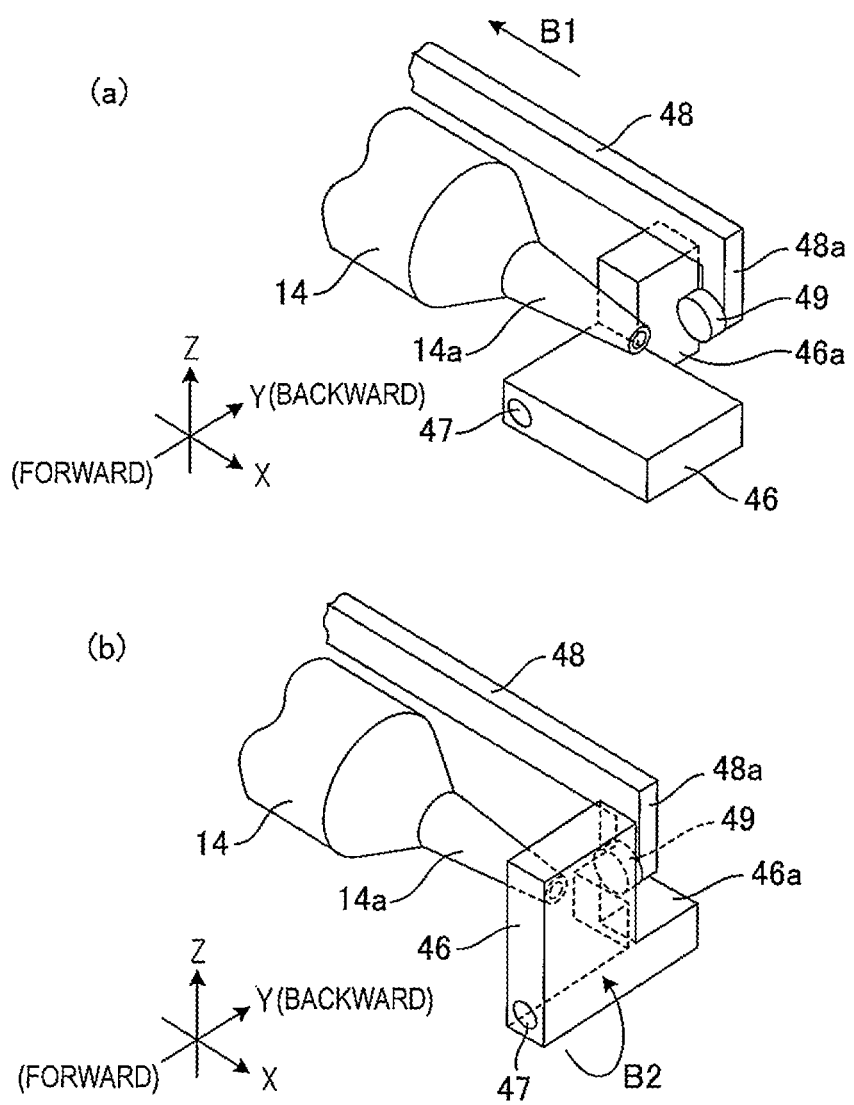
FIGS. 9 (a) and (b) are drawings for describing operation of a cap member of the screen printer of the embodiment of the present invention.

In FIG. 5 and FIGS. 9(a) and 9(b), a pressing piece 46a extending in a direction orthogonal to the cap member 46 is attached to a back side (the squeegee base side 30) of the swayingly-supported end of the cap member 46. When the cap member 46 assumes an unclosed attitude, the pressing piece 46a is situated while standing upright from the swayingly-supported end of the cap member 46 [FIG. 5, FIG. 8(a), and FIG. 9(a)]. When the cap member 46 assumes a closed attitude, the pressing piece 46a is situated while horizontally extending from the swayingly-supported end of the cap member 46 toward the opposite side of the center of the squeegee base 30 [FIG. 8(c) and FIG. 9(b)]. The pressing piece 46a comes into contact with, from above, a second stopper 43b (FIG. 5 and FIG. 7) put on the front surface of the guide member attachment bracket 43 [FIG. 8(c)].

In FIGS. 5 and 7, the syringe attachment bracket 31 is outfitted with an arm member 48. The arm member 48 at a position opposite to the location of the guide member 44 (the right side of the drawing sheets in FIGS. 5 and 7) horizontally extends along the direction of movement of the syringe attachment bracket 31 (the X-axis direction). A leading end of the arm member 48 is downwardly bent as shown in FIGS. 5 and 7 and FIGS. 9(a) and 9(b), to thus form a bend 48a. The bend 48a is equipped with a second cam follower 49 that is rotatable around a shaft (not shown) projecting in a horizontal forward direction (the Y-axis direction).

As mentioned above, during the course of the paste feed syringe 14 changing its position from the paste feed attitude to the storage attitude as a result of the syringe drive motor 36 being driven, the second cam follower 49 provided on the bend 48a of the arm member 48 comes into contact with the pressing piece 46a of the cap member 46 in the unclosed attitude from the direction of the center of the squeegee base 30 (the right side of the drawing sheets of FIGS. 5 and 7), thereby subsequently pressing the cap member 46 toward the guide member 44 (the left side of the drawing sheets of FIGS. 5 and 7) [as designated by arrow B1 shown in FIG. 9(a)]. The cap member 46 is thereby swayed around the cap member swaying shaft 47, to thus change its position from the horizontal unclosed attitude to the vertical closed attitude [as designated by arrow B2 shown in FIG. 9(b)]. The cap member thus closes (puts a cap on) the nozzle 14a of the paste feed syringe 14 from side immediately after the paste feed syringe 14 has been switched to the storage attitude. As mentioned above, the cap member 46 closes (covers) the nozzle 14a when the paste feed syringe 14 assumes the storage attitude after having turned through about 90 degrees from the paste feed attitude. Therefore, there is prevented dripping of the paste Pst from the nozzle 14a, which would otherwise arise when the paste feed syringe 14 assumes the storage attitude in which the paste Pst is not fed.

When the paste feed syringe 14 changes form the storage attitude to the paste feed attitude, the nozzle 14a of the paste feed syringe 14 pushes the upright standing cap member 46 to the center (the right side of the drawing sheets of FIGS. 5 and 7) of the squeegee base 30. The cap member 46 sways around the cap member swaying shaft 47, to thus change its position from the vertical closed attitude to the horizontal unclosed attitude (the pressing piece 46a changes from the horizontal attitude to the vertical attitude). The nozzle 14a of the paste feed syringe 14 is released from the closed state provided by the cap member 46 [FIG. 8(c) to FIG. 8(b) to FIG. 8(a)]. There can also be adopted a structure for forcefully actuating the cap member 46 toward the unclosed attitude by means of a spring, or the like, in such a way that the nozzle enters the unclosed state without fail when the cap member 46 is not pressed by the second cam follower 49.

In the screen printer 1, a controller 50 (FIG. 10) controls operation of a substrate conveyance path actuation mechanism 51 (FIG. 10) built from an un-illustrated actuator, or the like, whereby the carry-in conveyor 25, the positioning conveyor 23, and the carry-out conveyor 26, serving as substrate conveyor paths for conveying the substrate 2, operate. The controller 50 controls operation of a clamping member actuation mechanism 52 (FIG. 10) built from an un-illustrated actuator, or the like, whereby the clamping members 24 clamp the substrate 2.

The controller 50 controls operation of a substrate positioning unit actuation mechanism 53 (FIG. 10) built from actuators, like a Y table actuation motor My and an X table actuation drive motor Mx (see FIGS. 2 and 3), whereby the following operations take place. The Y table 21a moves in the Y-axis direction with respect to the bench 11. The X table 21b moves in the X-axis direction with respect to the Y table 21a. A θ table 21c (i.e., the base table 21d) turns around the Z axis with respect to the X table 21b. The first elevation table 22a ascends or descends with respect to the base table 21d. The second elevation table 22b (i.e., the receiver unit 22c) ascends or descends with respect to the first elevation table 22a.

The controller 50 controls operation of a camera unit actuation mechanism 54 (FIG. 10) built from an un-illustrated actuator, thereby causing movement of the camera unit 16 within a horizontal plane. Specifically, the X-axis stage 29a moves in the Y-axis direction with respect to the pair of gantry frames 28, and the camera support stage 29b moves in the X-axis direction with respect to the X-axis stage 29a.

Operation of the squeegee base 39 that reciprocally actuates the pair of squeegees 15 in the Y-axis direction is achieved by means of the controller 50 controlling a squeegee actuation mechanism 55 (FIG. 10) built from an un-illustrated actuator, or the like. The controller 50 controls operation of a squeegee elevation cylinder 56 attached to an upper portion of the squeegee base 30, whereby the respective squeegees 15 ascend or descend with respect to the squeegee base 30.

The controller 50 controls operation of the syringe drive motor 36, thereby controlling driving operation for driving the paste feed syringe 14 in the X-axis direction. The controller 50 controls operation of a paste feed mechanism 57 (FIG. 10) built from an un-illustrated actuator, or the like, whereupon the paste feed syringe 14 feeds the paste Pst.

Figure 11:
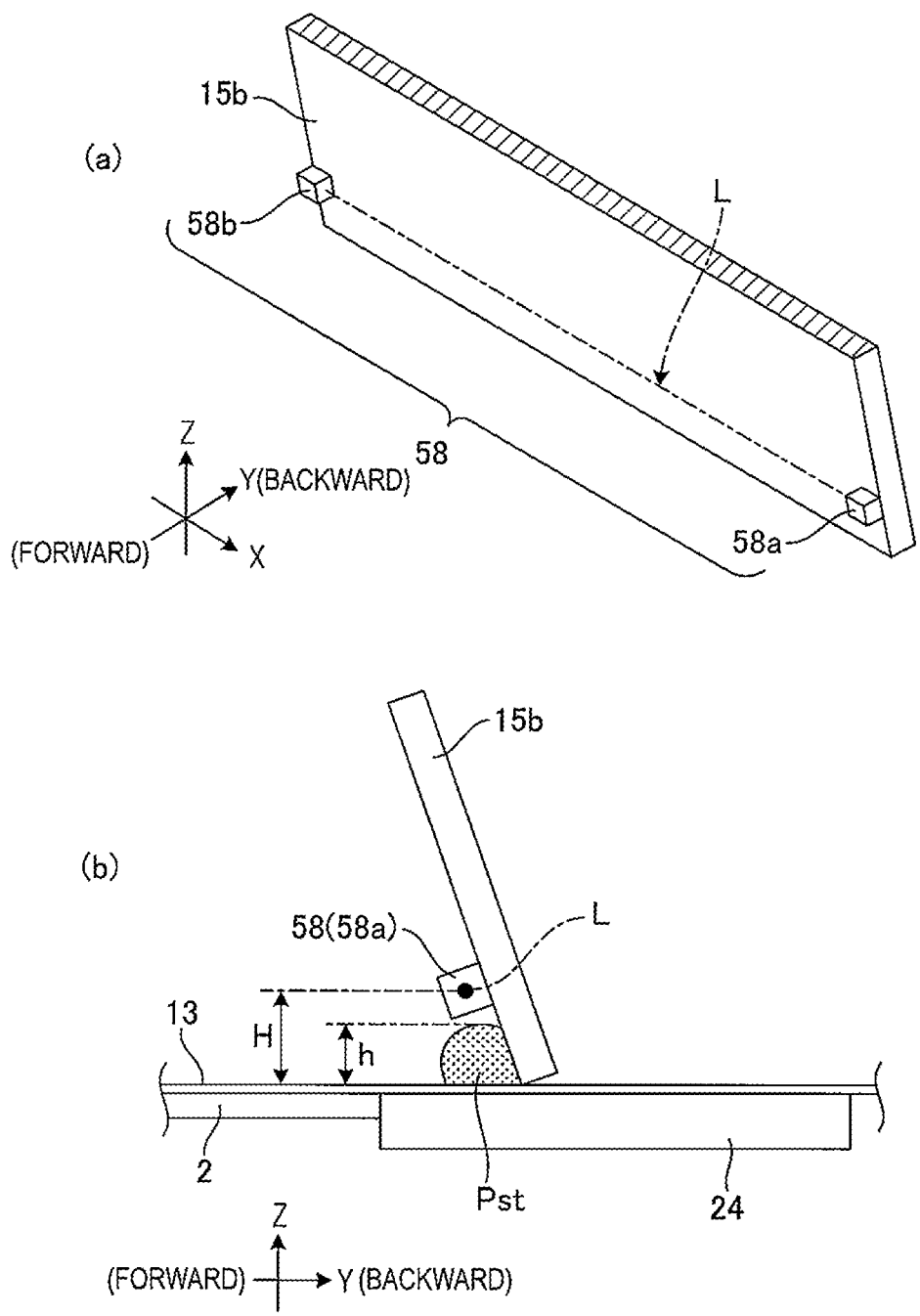
FIG. 11 (a) is a perspective view of a back squeegee of the screen printer of the embodiment of the present invention, and (b) is a side view of the back squeegee of the screen printer of the embodiment of the present invention.

In FIG. 11(*a*), a squeegee surface of the back squeegee 15b (a surface that scrapes the paste Pst and that is directed to the front in the case of the back squeegee 15b) is provided with a paste height detection sensor 58. The paste height detection sensor 58 is built from a projector 58a and a light receiver 58b. The projector 58a is disposed at one end of the back squeegee 15b in its widthwise direction (i.e., the X-axis direction) and projects inspection light L in the X-axis direction. The paste height detection sensor 58b is disposed at the other end of the back squeegee 15b in its widthwise direction and receives the inspection light L projected by the projector 58a.

Detecting that the light receiver 58b has received the inspection light L projected by the projector 58a of the paste height detection sensor 58 while the back squeegee 15b remains in contact with the paste Pst on the mask plate 13 [i.e., a state shown in FIG. 11(*b*)], the controller 50 ascertains that a height "h" of the paste Pst [FIG. 11(*b*)] is below a predetermined value (a predetermined height) H [FIG. 11(*b*)] equal to the height of the inspection light L measured from the upper surface the mask plate 13 and that feeding the paste Pst is required.

Figure 10:
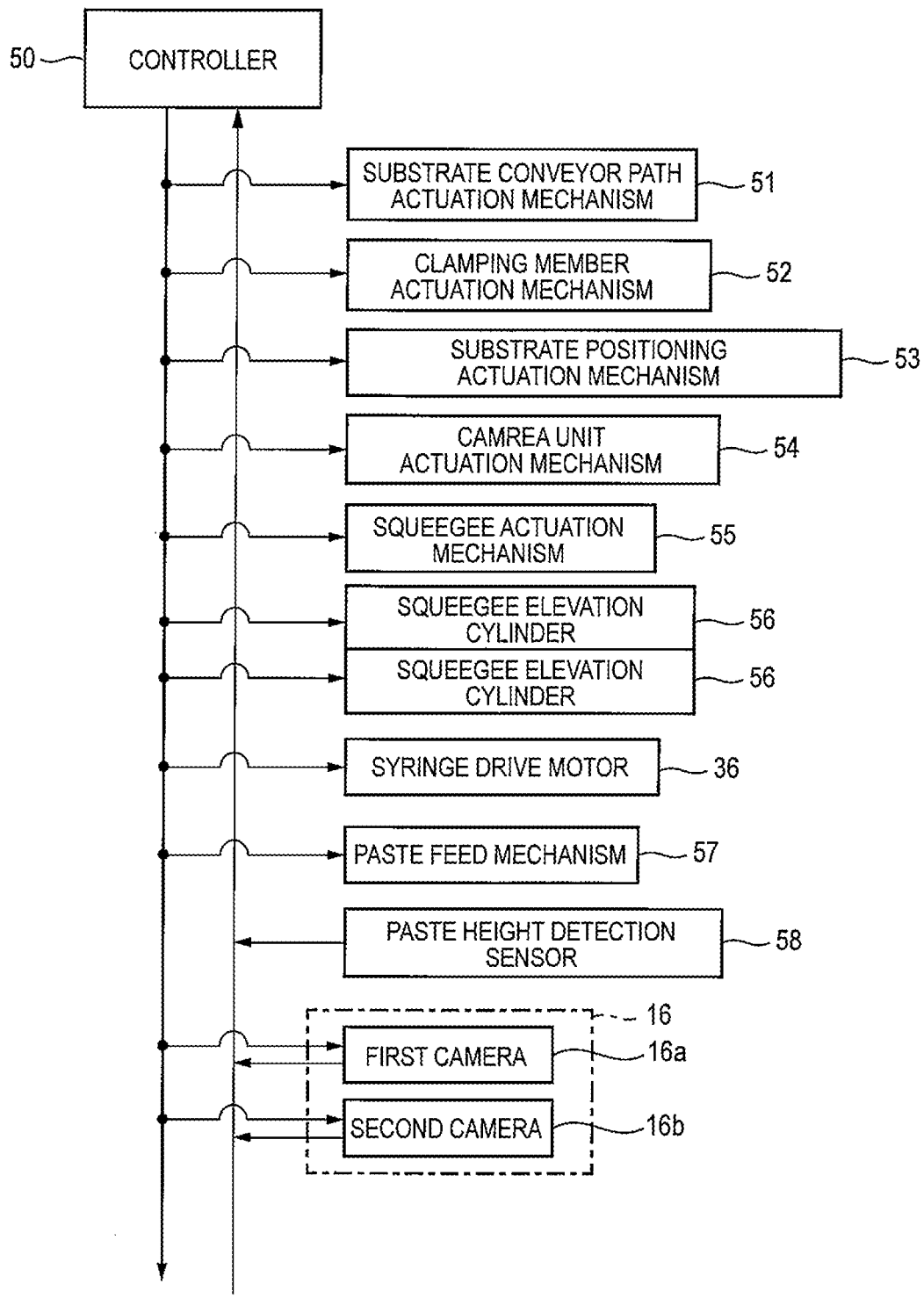
FIG. 10 is a block diagram showing a control system of the screen printer of the embodiment of the present invention.

Under control of the controller 50, the first camera 16a making up the camera unit 16 captures an image of the substrate-side register mark mk on the substrate 2 positioned at the working position by the substrate positioning unit 12. Under control of the controller 50, the second camera 16b captures an image of the mask-side register mark MK put on the mask plate 13. Both image data pertaining to the image captured by means of imaging operation of the first camera 16a and image data pertaining to the image captured by means of imaging operation of the second camera 16b are input to the controller 50 (FIG. 10).

Figure 12:
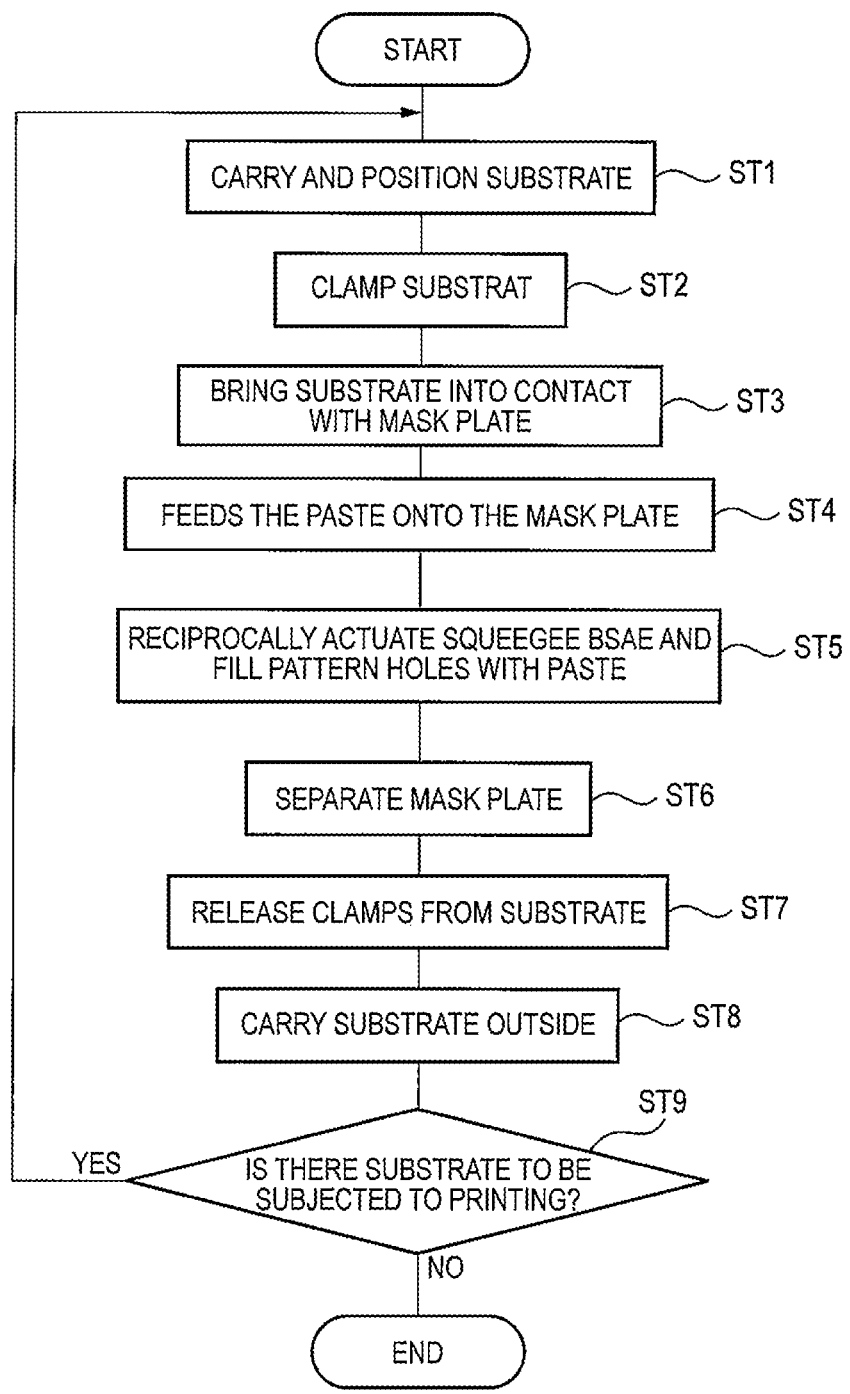
FIG. 12 is a flowchart showing flow of processing pertaining to a screen printing process performed by the screen printer of the embodiment of the present invention.
Figure 13:
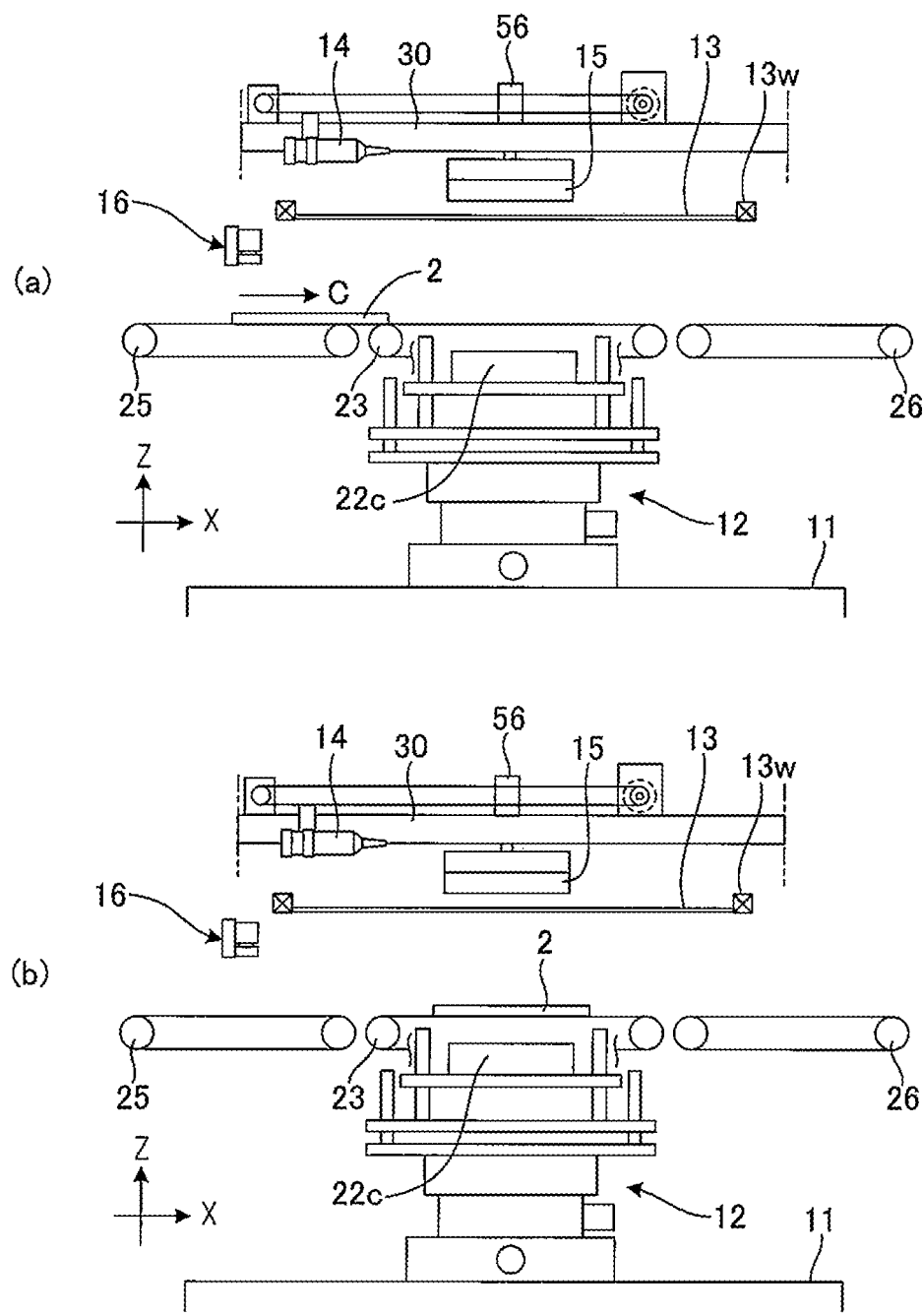
FIGS. 13 (a) and (b) are drawings for describing operation of the screen printer of the embodiment of the present invention.

Operation of the screen printer 1 is now described by use of a flowchart shown in FIG. 12 and operation descriptive views shown in FIGS. 13(*a*) to 16(*c*). Detecting that the operator OP (or an un-illustrated another machine disposed at an upstream position with respect to the screen printer 1) has loaded the substrate 2 into the carry-in conveyor 25 by un-illustrated detection means, the controller 50 of the screen printer 1 performs the following operations. Namely, the carry-in conveyor 25 and the positioning conveyor 23 are synchronously activated so as to carry the substrate 2 into the screen printer 1 [as designated by arrow C shown in FIG. 13(*a*)]. When un-illustrated detection means has detected that the substrate 2 conveyed by the positioning conveyor 23 reached the predetermined working position, the controller halts operation of the positioning conveyor 23 and performs positioning of the substrate 2 [FIG. 13(*b*): a step of carrying and positioning a substrate; i.e., step ST1 shown in FIG. 12].

Figure 14:
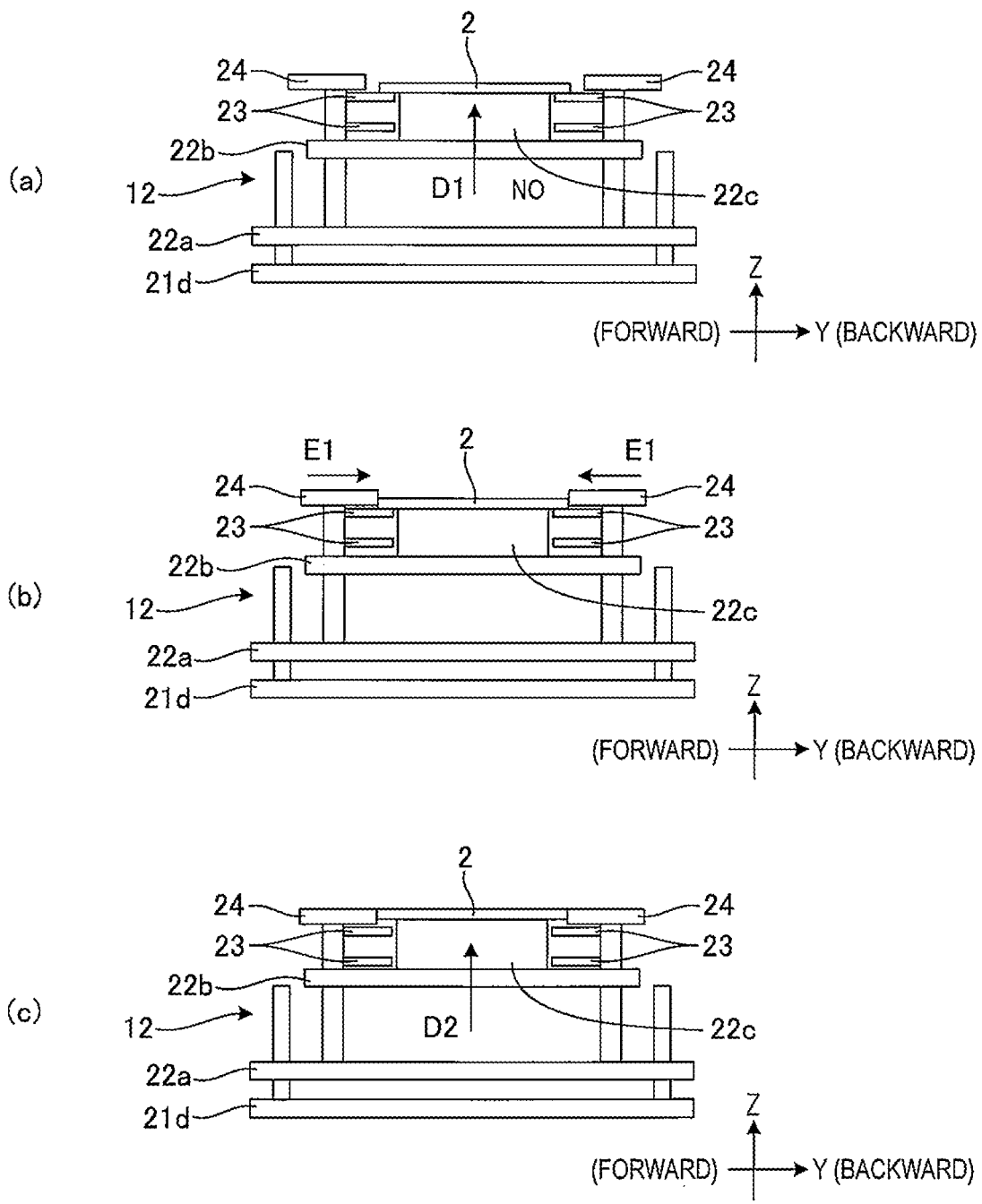
FIGS. 14 (a), (b), and (c) are drawings for describing operation of the screen printer of the embodiment of the present invention.

After the substrate 2 has been placed at the working position, the controller 50 causes the second elevation table 22b of the vertical positioning section 22 provided in the substrate positioning unit 12 to ascend with respect to the first elevation table 22a [as designated by arrow D1 shown in FIG. 14(*a*)]. When the receiver unit 22c has contacted a lower surface of the substrate 2, ascending action of the second elevation table 22b is halted. Subsequently, the clamping members 24 are activated, to thus clamp both sides of the substrate 2 on the positioning conveyor 23 [as designated by arrow E1 shown in FIG. 14(*b*): a substrate clamping step: step ST2 shown in FIG. 12].

After the clamping members 24 have clamped and held the substrate 2, the controller 50 again raises the second elevation table 22b with respect to the first elevation table 22a [as designated by arrow D2 shown in FIG. 14(*c*)], whereupon the substrate 2 is pushed up by means of the receiver unit 22c. The substrate 2 thereby ascends with both ends thereof remaining in sliding contact with the clamping members 24 (the substrate 2 thereby departs upward from the positioning conveyor 23). When the upper surface of the substrate 2 has become substantially level with upper surfaces of the respective clamping members 24, lifting action of the receiver unit 22c is halted [FIG. 14(*c*)].

When the upper surface of the substrate 2 has become substantially level with the upper surfaces of the respective clamping members 24, the controller 50 halts lifting action of the receiver unit 22c and subsequently controls operation of the camera unit actuation mechanism 54, thereby moving the camera unit 16 to an area between the substrate 2 and the mask plate 13. The controller then causes the first camera 16a to capture an image of the substrate-side register mark mk put on the substrate 2 and also causes the second camera 16b to capture an image of the mask-side register mark MK put on the mask plate 13. The controller ascertains the position of the substrate 2 from the thus-acquired image data pertaining to the substrate-side register mark mk and also the position of the mask plate 13 from the thus-acquired image data pertaining to the mask-side register mark MK.

Figure 15:
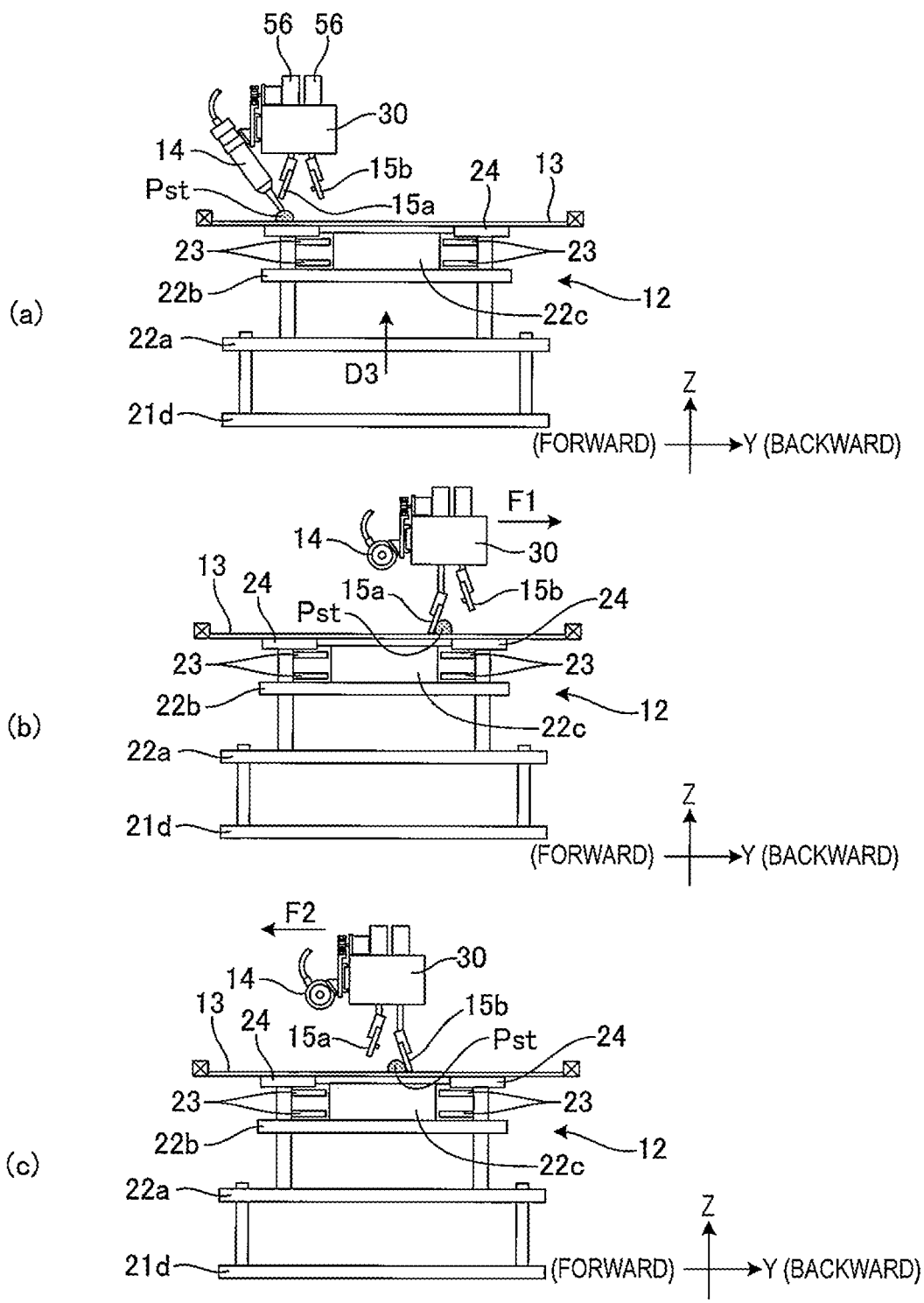
FIGS. 15 (a), (b), and (c) are drawings for describing operation of the screen printer of the embodiment of the present invention.

After having ascertained the position of the substrate 2 and the position of the mask plate 13, the controller 50 controls operation of the horizontal inplane positioning section 21 provided in the substrate positioning unit 12, thereby horizontally moving the substrate 2. The substrate 2 and the mask plate 13 are thereby positioned in the horizontal direction in such a way that the substrate-side register mark mk and the mask-side register mark MK vertically oppose each other. After horizontal positioning of the substrate 2 and the mask plate 13 has finished, the controller 50 lifts the first elevation table 22a of the vertical positioning section 22 provided in the substrate positioning unit 12 with respect to the base table 21d [as designated by arrow D3 shown in FIG. 15(*a*)], thereby bringing an upper surface of the substrate 2, which is a surface to be printed, into contact with the mask plate 13 from below [FIG. 15(a): a substrate-mask plate contact step: step ST3 shown in FIG. 12]. The pattern holes ph of the mask plate 13 and the electrodes 3 on the substrate 2 thereby coincide with each other in the vertical direction.

After having brought the substrate 2 into contact with the mask plate 13, the controller 50 feeds the paste Pst onto the mask plate 13 as required (a paste feeding step: step ST4 shown in FIG. 12). When feeding the paste Pst is carried out, the controller 50 first moves the squeegee base 30 in the Y-axis direction such that the front squeegee 15a comes to a position immediately above the front clamping member 24. The controller controls driving operation of the syringe drive motor 36, thereby activating the syringe drive mechanism 40. The paste feed syringe 14 is thereby driven in the X-axis direction over the front area of the squeegee base 30. The paste feed syringe 14 is turned around the axial line 41 from the storage attitude through 90 degrees to thereby assume the paste feed attitude. The controller then causes the paste feed syringe 14 to feed the paste Pst over the mask plate 13 located immediately below the front squeegee 15a. The syringe drive mechanism 40 drives the paste feed syringe 14 in the X-axis direction at the time of feeding of the paste Pst such that the paste Pst is uniformly fed over the substrate 2 in its widthwise direction. After the paste feed syringe 14 has finished feeding the paste Pst over the mask plate 13, the controller 50 drives the syringe drive mechanism 40, thereby changing the position of the paste feed syringe 14 from the paste feed attitude to the storage attitude.

The controller 50 brings the substrate 2 into contact with the mask plate 13 and feeds the paste Pst over the mask plate 13, as required. Subsequently, the controller reciprocally drives the squeegee base 30 in the Y-axis direction, thereby filling the pattern holes ph of the mask pattern MP of the mask plate 13 with the paste Pst (a paste charging step: ST5 shown in FIG. 12). Specific operation for charging the paste Pst first includes lowering the front squeegee 15a until a lower edge of the squeegee contacts the upper surface of the mask plate 13 and driving the front squeegee 15 toward the backward of the squeegee base 30, to thus cause the front squeegee 15a to make slidable movement over the mask plate 13 and rake the paste Pst up to an upper surface area of the back clamping member 24 [as designated by arrow F1 shown in FIG. 15(b)]. After the paste Pst has been raked up to the upper surface area of the back clamping member 24, driving of the squeegee base 30 is halted, and the front squeegee 15a is lifted so as to depart from the mask plate 13. In addition, the back squeegee 15b is lowered until its lower edge comes into contact with the upper surface of the mask plate 13. The squeegee base 30 is driven in a direction opposite to arrow F1, thereby causing the back squeegee 15b to make slidable movement over the mask plate 13. The paste Pst is thereby raked up to the upper surface area of the front clamping member 24 [as designated by arrow F2 shown in FIG. 15(c)]. The pattern holes ph of the mask plate 13 are thereby filled with the paste Pst.

Figure 16:
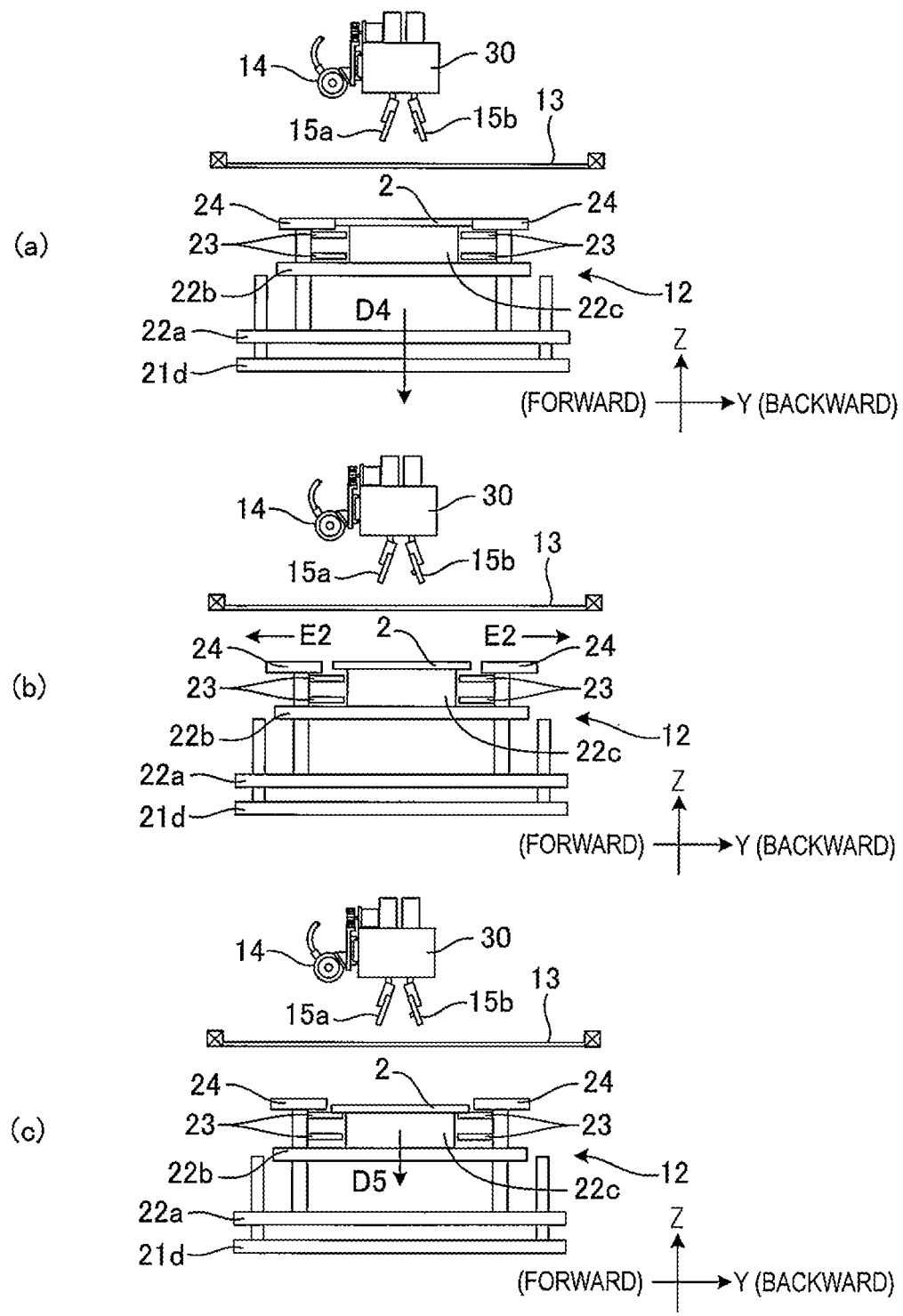
FIGS. 16 (a), (b), and (c) are drawings for describing operation of the screen printer of the embodiment of the present invention.

After having filled the pattern holes ph of the mask plate 13 with the paste Pst, the controller 50 lowers the first elevation table 22a with respect to the base table 21d, thereby making the mask plate 13 away from the substrate 2 [as designated by arrow D4 shown in FIG. 16(a)]. Separation of the mask plate is thereby carried out, whereby the paste Pst is printed on the electrodes 3 of the substrate 2 (a mask plate separation step: ST6 shown in FIG. 12).

After having finished printing of the paste Pst to the substrate 2, the controller 50 actuates the clamping members 24, to thus release the substrate 2 from the clamped state [as designated by arrow E2 shown in FIG. 16(b): a clamp release step: ST7 shown in FIG. 12]. The second elevation table 22b is lowered with respect to the first elevation table 22a, hereby lowering the substrate 2 onto the positioning conveyor 23 [as designated by arrow D5 shown in FIG. 16(c)]. The horizontal inplane positioning section 21 provided in the substrate positioning unit 12 is activated, thereby adjusting the position of the positioning conveyor 23 with respect to the carry-out conveyor 26. In addition, the positioning conveyor 23 and the carry-out conveyor 26 are actuated, thereby delivering the substrate 2 on the positioning conveyor 23 to the carry-out conveyor 26. The substrate is carried, as it is, to the outside of the screen printer 1 (a substrate carry-out step: step ST8 shown in FIG. 12).

After having carried the substrate 2 outside, the controller 50 determines whether or not there is another substrate 2 to be subjected to screen printing (a determination step: step ST9 shown in FIG. 12). As a result, when there is another substrate 2 to be subjected to screen printing, a routine returns to step ST1, where carry-in operation and positioning of the substrate 2 are performed. In contrast, when there is not another substrate 2 to be subjected to screen printing, a set of processing operations pertaining to the screen printing step end.

In relation to such a screen printing step, when raking the paste Pst to the front of the mask plate 13 by means of the back squeegee 15b in the paste charging step ST5, the controller 50 determines, from detection information sent from the paste height detection sensor 58, whether or not the height "h" [FIG. 11(b)] of the paste Pst located ahead of the back squeegee 15b is lower than the predetermined value H [FIG. 11(b)]. When ascertained, from a determination result showing that the height "h" of the paste Pst is lower than the predetermined value H equivalent to the height of the inspection light L measured from the upper surface of the mask plate 13, that feeding the paste Pst is required, the controller stores a message to this effect (i.e., a message to the effect that the controller has ascertained a necessity to feed the paste Pst) into an unillustrated storage section. Before performing processing pertaining to the next paste charging step (step ST5), the paste feed syringe 14 is changed from the storage attitude to the paste feed attitude, and feeding the paste Pst over the mask plate 13 (step ST4) is performed. Additional paste Pst is thereby added to the paste Pst already applied over the front clamping member 24, so that the decreased quantity of paste Pst is recovered. Further, the screen printer is configured such that the paste Pst is fed to the position immediately below the front squeegee 15a while the paste Pst remains raked to the front. Therefore, even if feeding the paste Pst is performed in the middle of conveyance of the substrate 2, the paste Pst will not drip from the pattern holes ph of the mask plate 13.

As mentioned above, the screen printer 1 of the embodiment includes the mask plate 13, the squeegees 15, the paste feed syringe 14, the syringe drive mechanism 40, and the guide member 44. The mask plate 13 on which the mask pattern MP conforming to the layout of the electrodes 3 on the substrate 2 is formed is brought into contact with the upper surface of the substrate 2. The squeegees 15 are attached to the squeegee base 30 that reciprocally travels over the area above the mask plate 13 in the horizontal direction. Remaining in contact with the mask plate 13 from above, the squeegees 15 move in the horizontal direction along with the squeegee base 30, thereby making sliding movement over the mask plate 13. The pattern holes ph of the mask pattern MP are filled with the paste Pst thus raked on the mask plate 13. The paste feed syringe 14 is attached so as to be swayable around the axial line 41 that downwardly extends from the squeegee base 30 at an angle with respect to a horizontal line HL and within the vertical plane parallel to the direction of reciprocal movement of the squeegee base 30. The paste feed syringe 14 can change its position between the paste feed attitude that has an imaginary extension within the vertical plane at an oblique angle with respect to the vertical line VL such that the nozzle 14a provided at the lower end of the paste feed syringe 14 comes to the position immediately below the squeegees 15 (i.e., the front squeegee 15a) and the storage attitude that is turned from the paste feed attitude through about 90 degrees around the axial line 41. The syringe drive mechanism 40 drives the paste feed syringe 14 in the horizontal direction orthogonal to the direction of reciprocal movement of the squeegee base 30. The syringe drive mechanism 40 has the guide member 44 including the guide surface 44a. When the paste feed syringe 14 in the paste feed attitude is driven by the syringe drive mechanism 40 in the horizontal direction orthogonal to the direction of reciprocal movement of the squeegee base 30, the guide surface guides, as a driven member disposed at a position below the axial line 41 of the paste feed syringe 14, the first cam follower 45 and sways the paste feed syringe 14 around the axial line 41 through about 90 degrees, thereby bringing the paste feed syringe 14 into the storage attitude.

In the screen printer 1 of the present embodiment, the paste feed syringe 14 is attached so as to be swayable around the axial line 41 that downwardly extends from the squeegee base 30 at an angle with respect to the horizontal line HL and within the vertical plane parallel to the direction of reciprocal movement of the squeegee base 30. The paste feed syringe can change its position between the paste feed attitude and the storage attitude such that the nozzle provided 14a at the lower end of the paste feed syringe comes to the position immediately below the squeegees 15 (the front squeegee 15a). Specifically, the paste feed attitude has an imaginary extension within the vertical plane extending in an oblique direction with respect to the vertical line, and the storage attitude is turned from the paste feed attitude through about 90 degrees around the axial line. Accordingly, even when the paste feed syringe 14 is provided at an area ahead of the squeegee base as viewed from a working position of the operator OP such that operation for filling the paste feed syringe 14 with paste becomes facilitated, the area ahead of the squeegee base 30 can be switched to an open state by means of bringing the paste feed syringe into the storage attitude. Replacement of the squeegees 15 can also be easily performed.

Moreover, the syringe drive mechanism 40 is utilized as a mechanism for switching the paste feed syringe 14 from the paste feed attitude to the storage attitude. In order to cause the paste feed syringe to uniformly feed the paste Pst over the substrate 2 in its widthwise direction, the syringe drive mechanism drives the paste feed syringe 14 in the horizontal direction orthogonal to the direction of reciprocal movement of the squeegee base 30. Therefore, the configuration for bringing the paste feed syringe 14 into the storage attitude can be simplified.

The screen printer 1 of the present embodiment also has the cap member 46. When the paste feed syringe 14 in the paste feed attitude is driven by the syringe drive mechanism 40 in the horizontal direction orthogonal to the direction of reciprocal movement of the squeegee base 30 to thereby assume the storage attitude, the arm member 48 that serves as a travel member for traveling as one along with the paste feed syringe 14 presses the cap member 46, whereupon the cap member 46 is turned, to thus cap the nozzle 14a of the paste feed syringe 14 held in the storage attitude. There is prevented dripping of the paste Pst from the nozzle 14a, which would otherwise arise when the paste feed syringe 14 assumes the storage attitude in which the syringe does not feed the paste Pst. Therefore, staining of the mask plate 13, which would otherwise be caused by the dripped paste Pst, is prevented. In addition, the time required to clean the dripped paste Pst becomes obviated, so that workability can be enhanced correspondingly.

Although the embodiment of the present invention has been described thus far, the present invention is not limited to the embodiment. For instance, in the embodiment, the screen printer 1 has two squeegees 15 (the front squeegee 15a and the back squeegee 15b). However, the screen printer is a mere exemplification, and another screen printer having only one squeegee 15 can also be adopted.

Although the present invention has been described in detail and by reference to the specific embodiment, it is manifest to those skilled in the art that the present invention be susceptible to various alterations and modifications without departing the spirit and scope of the present invention.

The present invention is based on Japanese Patent Application (JP-A-2010-002515) filed on Jan. 18, 2010 in Japan, the entire subject matter of which is incorporated herein by reference.

INDUSTRIAL APPLICABILITY

There is provided a screen printer arranged so as to be able to easily perform operation for replacing squeegees and operation for filling a paste feed syringe with paste.

DESCRIPTIONS OF THE REFERENCE NUMERALS AND SYMBOLS

1 SCREEN PRINTER
2 SUBSTRATE
3 ELECTRODE
13 MASK PLATE
14 PASTE FEED SYRINGE
14a NOZZLE
15 SQUEEGEE
30 SQUEEGEE BASE
40 SYRINGE DRIVE MECHANISM
41 AXIAL LINE
44 GUIDE MEMBER
44a GUIDE SURFACE
45 FIRST CAM FOLLOWER (DRIVEN MEMBER)
46 CAP MEMBER
48 ARM MEMBER (TRAVEL MEMBER)
HL Horizontal Line
VL VERTICAL LINE
MP MASK PATTERN
pH PATTERN HOLE
Pst PASTE
OP OPERATOR

The invention claimed is:

1. A screen printer comprising:
a mask plate that is brought into contact with an upper surface of a substrate and on which a mask pattern conforming to a layout of electrodes on the substrate is formed;
a squeegee that is attached to a squeegee base which reciprocally travels over an area above the mask plate in a horizontal direction, that moves in a horizontal direction along with the squeegee base while remaining in contact with the mask plate from above, and that makes sliding movement over the mask plate, thereby filling pattern holes of the mask pattern with paste raked on the mask plate;

a paste feed syringe that is attached to the squeegee base so as to be swayable around an axial line downwardly extending from the squeegee base at an angle with respect to a horizontal line and within a vertical plane parallel to the direction of reciprocal movement of the squeegee base and that is configured to change its position between a paste feed attitude having an imaginary extension within the vertical plane at an oblique angle with respect to a vertical line and a storage attitude which is turned from the paste feed attitude around the axial line, wherein the paste feed syringe includes a follower disposed at a position below the axial line of the paste feed syringe;

a syringe drive mechanism that drives the paste feed syringe in a horizontal direction orthogonal to the direction of reciprocal movement of the squeegee base; and a guide member having a guide surface that guides the follower of the paste feed syringe when the paste feed syringe in the paste feed attitude is driven in the horizontal direction orthogonal to the direction of reciprocal movement of the squeegee base by the syringe drive mechanism and that sways the paste feed syringe around the axial line, thereby bringing the paste feed syringe into the storage attitude, wherein the guide member projects from a surface of the squeegee base in a direction parallel to the direction of the reciprocal movement of the squeegee base.

2. The screen printer according to claim 1, wherein the paste feed syringe is disposed at an area ahead of the squeegee base as viewed from a working position of an operator.

3. The screen printer according to claim 1, further comprising a cap member that, when the paste feed syringe in the paste feed attitude is driven by the syringe drive mechanism into the horizontal direction orthogonal to the direction of reciprocal movement of the squeegee base to thereby assume the storage attitude, is pressed and turned by a travel member that travels as one along with the paste feed syringe, thereby covering the nozzle of the paste feed syringe in the storage attitude.

4. The screen printer according to claim 1, wherein the guide surface of the guide member is curved with a gradual descent toward a center of the squeegee base in a direction parallel to the horizontal direction in which the paste feed syringe is driven.

* * * * *